US010115817B2

(12) United States Patent
Zundel et al.

(10) Patent No.: US 10,115,817 B2
(45) Date of Patent: Oct. 30, 2018

(54) METHOD OF MANUFACTURING A SEMICONDUCTOR DEVICE

(71) Applicant: Infineon Technologies AG, Neubiberg (DE)

(72) Inventors: Markus Zundel, Egmating (DE); Peter Brandl, St. Georgen i.G. (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/157,645

(22) Filed: May 18, 2016

(65) Prior Publication Data
US 2016/0268422 A1 Sep. 15, 2016

Related U.S. Application Data

(62) Division of application No. 14/045,925, filed on Oct. 4, 2013, now Pat. No. 9,349,854.

(51) Int. Cl.
| H01L 29/745 | (2006.01) |
| H01L 29/78 | (2006.01) |
| H01L 29/10 | (2006.01) |
| H01L 29/66 | (2006.01) |
| H01L 29/40 | (2006.01) |
| H01L 29/423 | (2006.01) |
| H01L 29/08 | (2006.01) |
| H01L 29/06 | (2006.01) |

(52) U.S. Cl.
CPC ...... *H01L 29/7813* (2013.01); *H01L 29/0623* (2013.01); *H01L 29/0634* (2013.01); *H01L 29/086* (2013.01); *H01L 29/0878* (2013.01); *H01L 29/105* (2013.01); *H01L 29/1083* (2013.01); *H01L 29/1095* (2013.01); *H01L 29/407* (2013.01); *H01L 29/42368* (2013.01); *H01L 29/66734* (2013.01); *H01L 29/7803* (2013.01); *H01L 29/7811* (2013.01); *H01L 29/7815* (2013.01); *H01L 29/0646* (2013.01)

(58) Field of Classification Search
None
See application file for complete search history.

(56) References Cited

U.S. PATENT DOCUMENTS

| 4,566,174 | A |   | 1/1986 | Yasuda et al. |
| 4,862,233 | A |   | 8/1989 | Matsushita et al. |
| 5,843,796 | A | * | 12/1998 | Disney ................ H01L 29/7396 257/E21.385 |

(Continued)

FOREIGN PATENT DOCUMENTS

| DE | 3720156 A1 | 12/1987 |
| DE | 102005009020 A1 | 8/2006 |

(Continued)

*Primary Examiner* — Ali Naraghi
(74) *Attorney, Agent, or Firm* — Murphy, Bilak & Homiller, PLLC

(57) ABSTRACT

A method of manufacturing a semiconductor device includes forming a first semiconductor layer on a semiconductor substrate of a first conductivity type having a continuous first area and a second area, introducing dopants of the first conductivity type in the continuous first area of the first semiconductor layer, forming a second semiconductor layer on the first semiconductor layer, and forming trenches in the second semiconductor layer in the continuous first area.

12 Claims, 12 Drawing Sheets

(56) References Cited

U.S. PATENT DOCUMENTS

| | | | |
|---|---|---|---|
| 6,885,062 B2* | 4/2005 | Zundel | H01L 29/7802 257/330 |
| 7,939,357 B2 | 5/2011 | Rhodes | |
| 2004/0248389 A1 | 12/2004 | Iwabuchi | |
| 2005/0110077 A1 | 5/2005 | Zundel et al. | |
| 2005/0275025 A1 | 12/2005 | Lanzerstorfer | |
| 2006/0211179 A1 | 9/2006 | Siemieniec et al. | |
| 2006/0231916 A1* | 10/2006 | Fukumoto | H01L 29/7833 257/500 |
| 2007/0120150 A1* | 5/2007 | Meyer | H01L 21/761 257/213 |
| 2013/0126967 A1* | 5/2013 | Toyoda | H01L 21/823481 257/334 |
| 2014/0034995 A1* | 2/2014 | Akiyama | H01L 29/7455 257/119 |
| 2014/0374823 A1 | 12/2014 | Bhalla et al. | |

FOREIGN PATENT DOCUMENTS

| | | |
|---|---|---|
| DE | 102005049593 A1 | 4/2007 |
| DE | 102008056195 A1 | 5/2009 |
| DE | 102011052605 A1 | 2/2013 |

\* cited by examiner

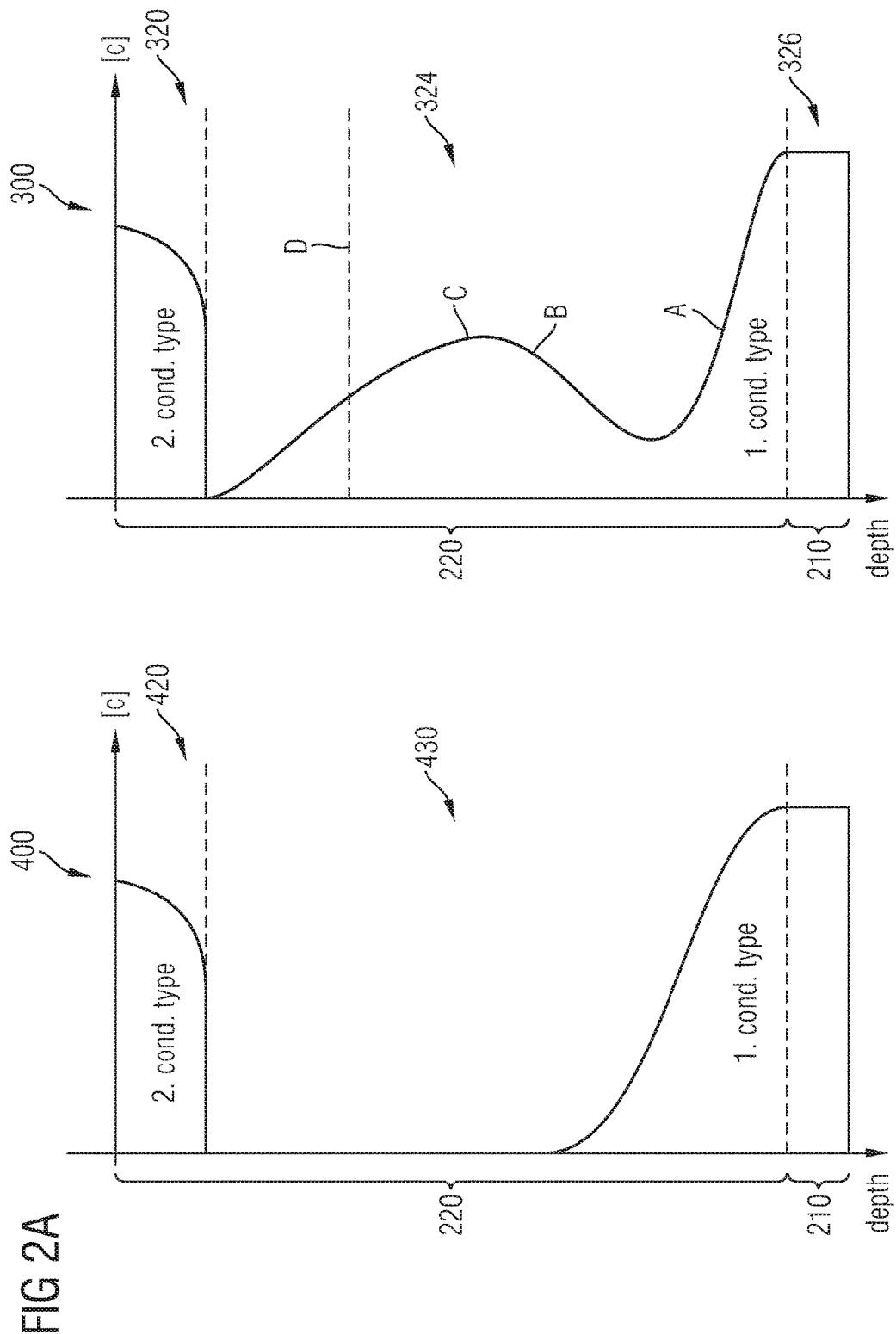

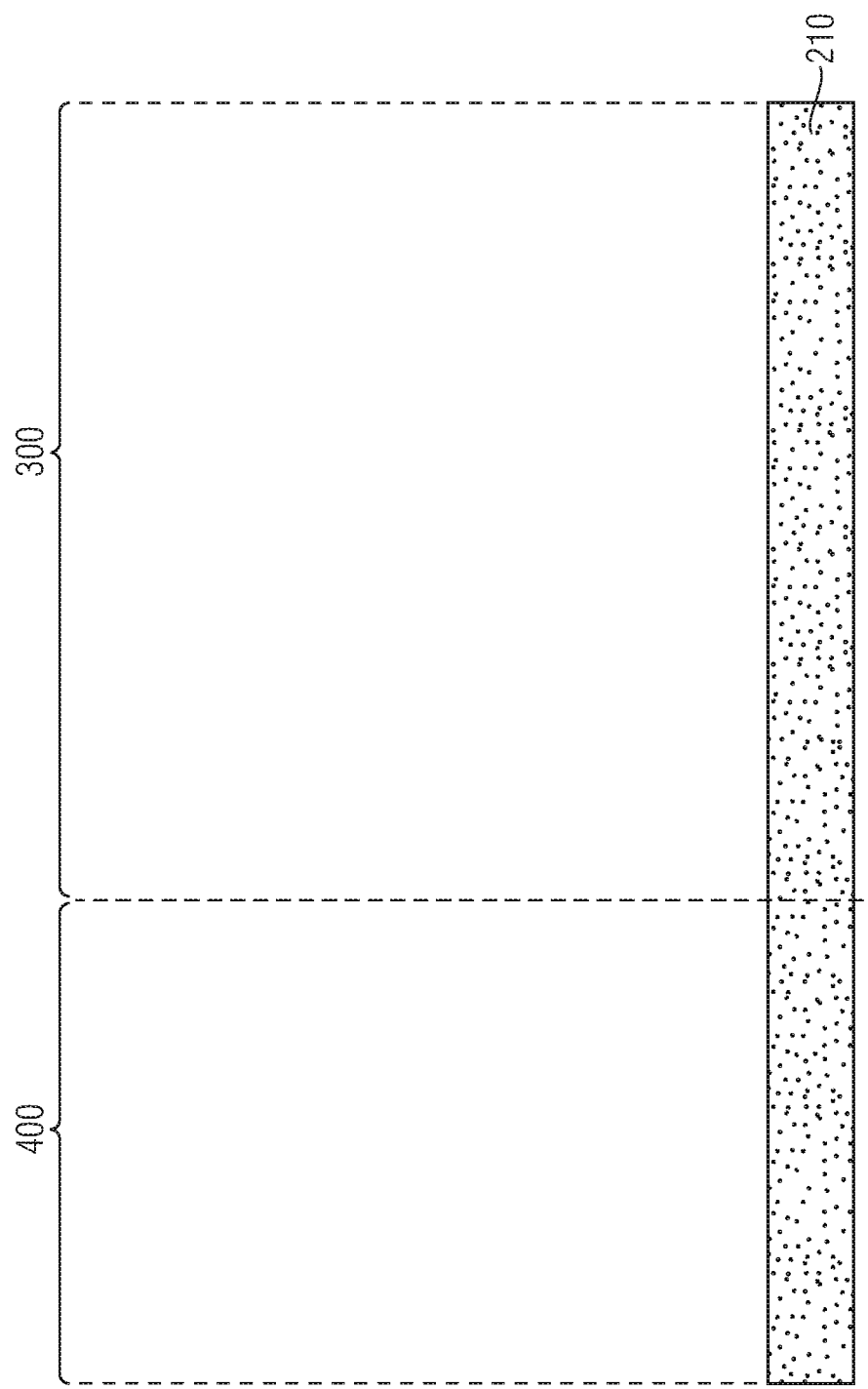

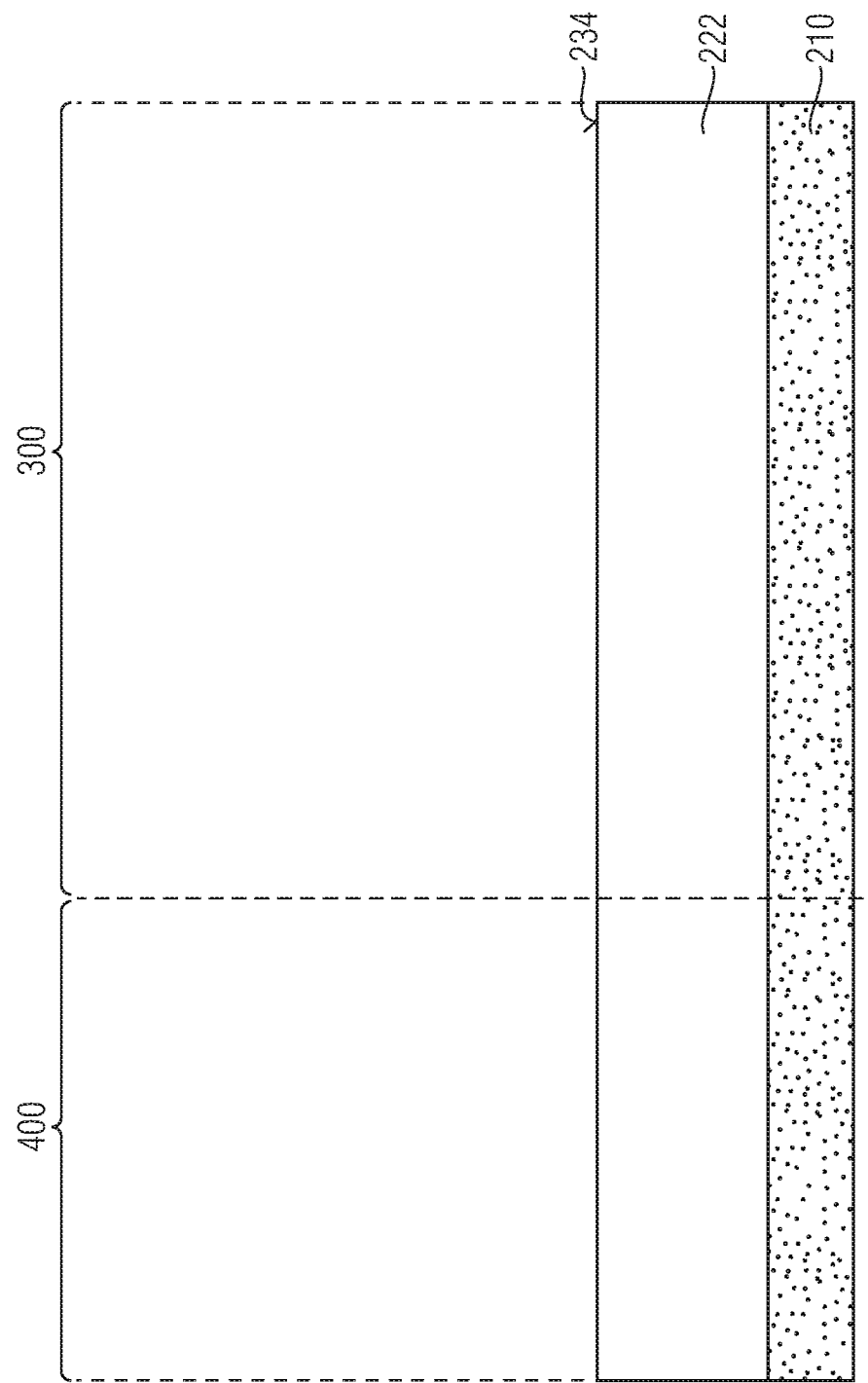

METHOD OF MANUFACTURING A SEMICONDUCTOR DEVICE

BACKGROUND

One application area of semiconductor technologies are power switches with various sensor- and protection functions. It has been proven beneficial to integrate vertical insulated gate field effect transistors (IGFETs), e.g. metal oxide semiconductor field effect transistors (MOSFETs) together with further semiconductor components in one power chip. The further semiconductor components may be bipolar semiconductor devices or sensor structures like a temperature sensor or a current sensor. It is desirable to improve flexibility when integrating vertical insulated gate field effect transistors like metal oxide field effect transistors together with further semiconductor components.

SUMMARY

According to an embodiment of a semiconductor device, the semiconductor device comprises a vertical IGFET in a first area of a semiconductor body. The vertical IGFET has a drift zone between a body zone and a drain electrode. The drift zone has a vertical dopant profile of a first conductivity type being a superposition of a first dopant profile declining with increasing distance from the drain electrode and dominating the vertical dopant profile in a first zone next to the drain electrode and a second dopant profile being a broadened peak dopant profile and dominating the vertical dopant profile in a second zone next to the body zone. The semiconductor device further includes a further semiconductor component formed in a second area of the semiconductor body, wherein the second dopant profile of the drift zone is absent in the second area.

According to another embodiment of a semiconductor device, the semiconductor device comprises a semiconductor substrate of a first conductivity type having a first area and a second area. The semiconductor device further includes a semiconductor layer structure on the semiconductor substrate having a vertical dopant profile of a first conductivity type being a superposition of a first dopant profile declining with increasing distance from the semiconductor substrate and a second dopant profile being a broadened peak dopant profile selectively formed in the first area of the semiconductor substrate. The semiconductor device further includes trenches formed in the semiconductor layer structure in the first area.

According to an embodiment of a method of manufacturing a semiconductor device, the method comprises forming a first semiconductor layer on a semiconductor substrate of a first conductivity type having a continuous first area and a second area. The method further includes introducing dopants of the first conductivity type in the continuous first area of the first semiconductor layer. The method further includes forming a second semiconductor layer on the first semiconductor layer. The method further includes forming trenches in the second semiconductor layer in the continuous first area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIGS. 2A and 2B are graphs illustrating a net dopant concentration versus a depth of the semiconductor device.

FIGS. 3 to 6 are schematic cross-sectional views illustrating a method of manufacturing a semiconductor device in accordance with an embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "$n^-$" means a doping concentration less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an n and a p+ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

It is to be understood that the features of the various embodiments described herein may be combined with each other, unless specifically noted otherwise.

Figure 1:
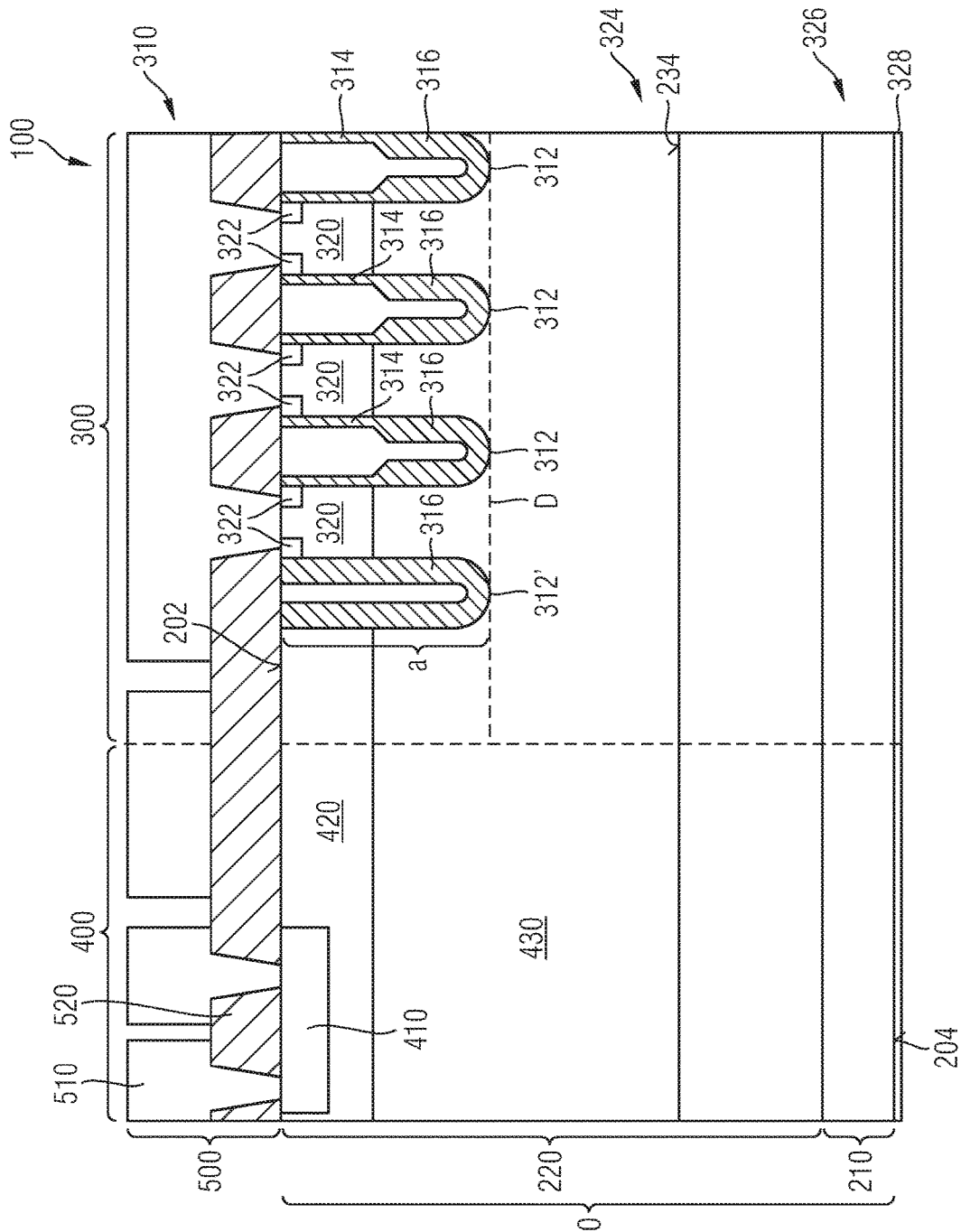
FIG. 1 is a schematic cross-sectional view of a portion of a semiconductor device according to an embodiment.

FIG. 1 shows a schematic cross-sectional view of a portion of a semiconductor device 100 according to an embodiment. The semiconductor device 100 includes a semiconductor body 200. The semiconductor body 200 includes semiconductor material, for example silicon Si, silicon carbide SiC, germanium Ge, silicon germanium SiGe, gallium nitride GaN or gallium arsenide GaAs. The semiconductor body 200 may include a semiconductor layer structure 220 having one or more semiconductor layer(s), e.g. epitaxial layer(s) on a semiconductor substrate 210. Outside the illustrated portion, the semiconductor body 200 may include, inter alia, further doped and undoped sections, semiconductor layers, insulating and conducting structures, for example.

The semiconductor body 200 has a first surface 202 and a second surface 204 which is opposite to the first surface 202. The semiconductor device 100 may include a first area 300 with at least one vertical IGFET 310 and a second area 400 with at least one further semiconductor component 410.

The vertical IGFET 310 includes trenches 312, which extend from the first surface 202 in a vertical direction into the semiconductor body 200. The term "vertical" as used in the specification intends to describe an orientation which is arranged perpendicular to the first surface 202 of the semiconductor body 200. The trenches 312 are formed in an upper part with a gate dielectric structure 314, e.g. a gate oxide structure adjoining the semiconductor layer structure 220 in the semiconductor body 200. The gate dielectric structure 314 merges into a field dielectric structure 316, e.g. a field oxide structure in a lower part the trenches 312. A termination trench 312' disposed next to the second area 400 includes no gate dielectric, and likewise serves for the edge termination of the vertical IGFET 310. The trenches 312 are filled with an electrode structure 318. The electrode structure 318 serves as a field electrode in the lower part of the trenches 312 and as a gate electrode for controlling a channel conductivity of the vertical IGFET 310 in the upper part of the trenches 312. According to another embodiments, the vertical IGFET 310 may include a gate electrode but no field electrode. According to yet another embodiment, the vertical IGFET 310 includes one, two, three or even more field electrodes. The field electrodes may be electrically separated from each other by a dielectric. The field electrodes may also be electrically coupled to a same reference voltage, e.g. a source potential or to different reference voltage(s).

In the vertical IGFET 310, body zones 320 are additionally formed in a mesa zone between adjacent trenches 312. Within the body zone 320, source zones 322 are likewise provided in a manner adjoining the gate dielectric structure 314, the source zones 322 reaching as far as the first surface 202 of the semiconductor body 200. The body zone 320 adjoins a drift zone 324 guiding a gate-controlled current between the source zone 322 and a drain zone 326 at the second surface 204 of the semiconductor body 200.

The drain zone 326 may comprise the semiconductor substrate 210 and the drift zone 324 may comprise at least a part of the semiconductor layer structure 220. The source zones 322, the drift zone 324, the drain zone 326 are of a first conductivity type, wherein the body zone 320 is of a second conductivity type. The trenches 312 extend from the first surface 202 through the body zones 320 into the drift zone 324 and have a depth a.

The semiconductor component 410 in the second area 400 is shown in a schematic manner and may comprise a plurality of different devices like components of a logical circuit, switches or sensor structures like a temperature sensor or a current sensor. The semiconductor component 410 is formed within the semiconductor body 200 and adjoins the first surface 202. The semiconductor component 410 is electrically isolated from a drain electrode 328 and/or the drain zone 326 via a junction isolation zone 420. The junction isolation zone 420 may be of the second conductivity type for insulating the semiconductor component 410 from an intermediate semiconductor zone 430 adjoining the junction isolation zone 420, and thus from the drain zone 326 and the drain electrode 328. The intermediate semiconductor layer may be lightly doped with dopants of the first conductivity type or may even be undoped. The dopant concentration of the first conductivity type of the intermediate semiconductor zone 430 may be set to an amount such that the pn junction of the junction isolation zone 420 and the intermediate semiconductor zone 430 in the second area 400 has a higher breakdown voltage than the vertical IGFET 310 in the first area 300.

The semiconductor component 410 and the at least one vertical IGFET 310 may be electrically connected via a wiring and insulation region 500 having a patterned wiring structure 510 and a patterned isolation structure 520 including one, two, three or even more wiring levels, e.g. metal and insulating levels.

The semiconductor layer structure 220 acts as the body zone 320 and as the drift zone 324 for the vertical IGFET 310 in the first area 300, and acts as the junction isolation zone 420 and the intermediate semiconductor zone 430 insulating the semiconductor component 410 from the semiconductor substrate 210 in the second area 400. This is caused by different vertical dopant profiles in the semiconductor layer structure 220 of the semiconductor body 200 in the first area 300 and in the second area 400, as will be illustrated in the following.

As shown in FIG. 2A, the semiconductor body 200 has a vertical net dopant profile in the first area 300, in which the body zone 320 is dominated by a vertical dopant profile of the second conductivity type. The semiconductor substrate 210 is of the first conductivity type. The drift zone 324 between the drain zone 326 or the semiconductor substrate 210 and the body zone 320 has a vertical dopant profile of the first conductivity type being a superposition of a first dopant profile A declining with increasing distance from the drain electrode 328 and dominating the vertical dopant profile in a first zone next to the drain electrode and a second dopant profile B being a broadened peak dopant profile and dominating the vertical dopant profile in a second zone next to the body zone 320.

The vertical dopant profile of the semiconductor body 200 in the second area 400 differs from the vertical dopant profile of the first area 300 in that the second dopant profile B of the first conductivity type in the drift zone 324 is absent in the second area 400 within the intermediate semiconductor zone 430. According to an embodiment, the vertical dopant profile of the drift zone 324 in the first area 300 has a local dopant maximum C in the second zone next to the body zone 320, as shown in FIG. 2A. According to an embodiment, the local dopant maximum C is located below the trenches 31, e.g. gate trenches of the vertical IGFET 310, as illustrated by the dashed line D in FIG. 1 and FIG. 2A.

Figure 2B:
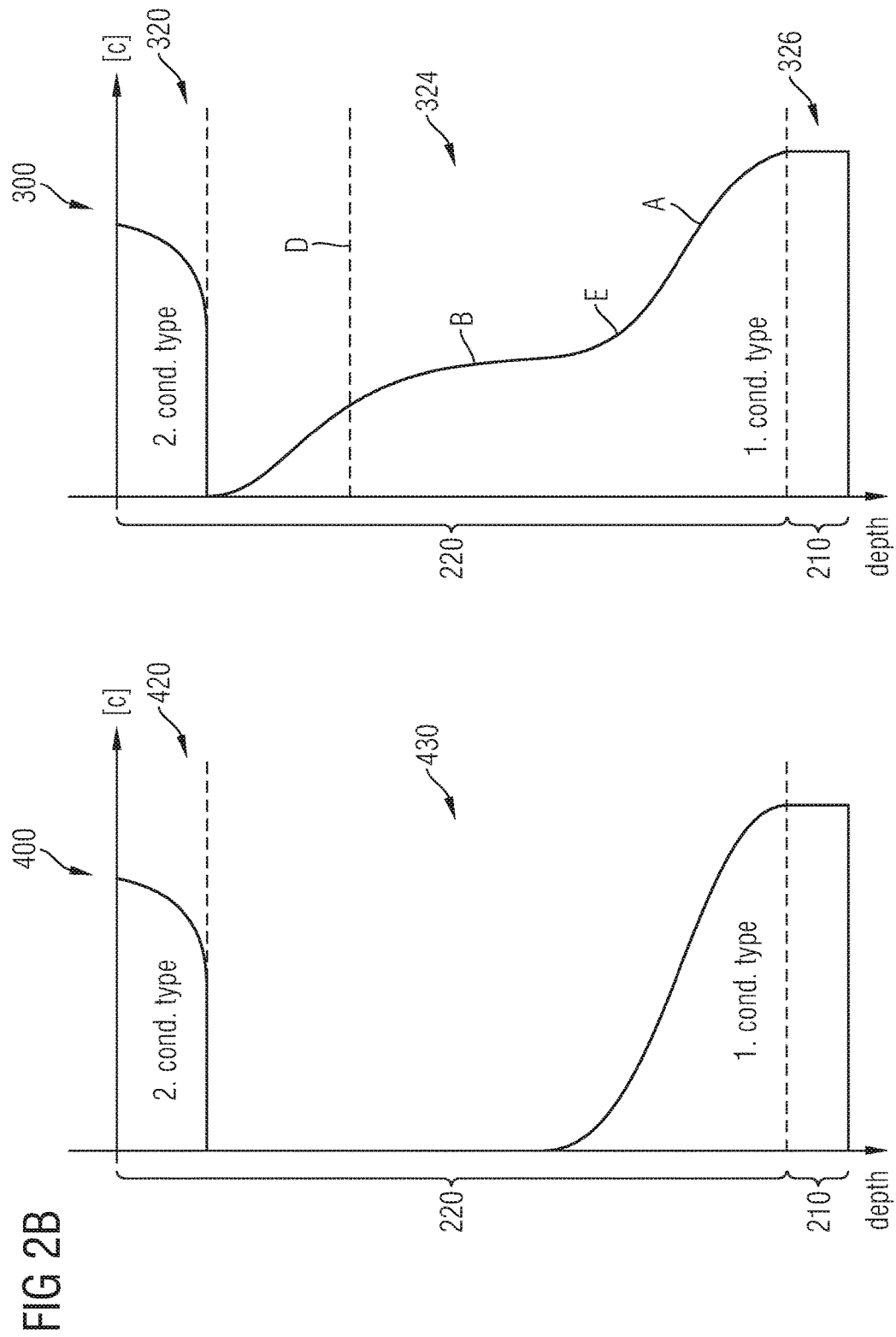
Figure 9:
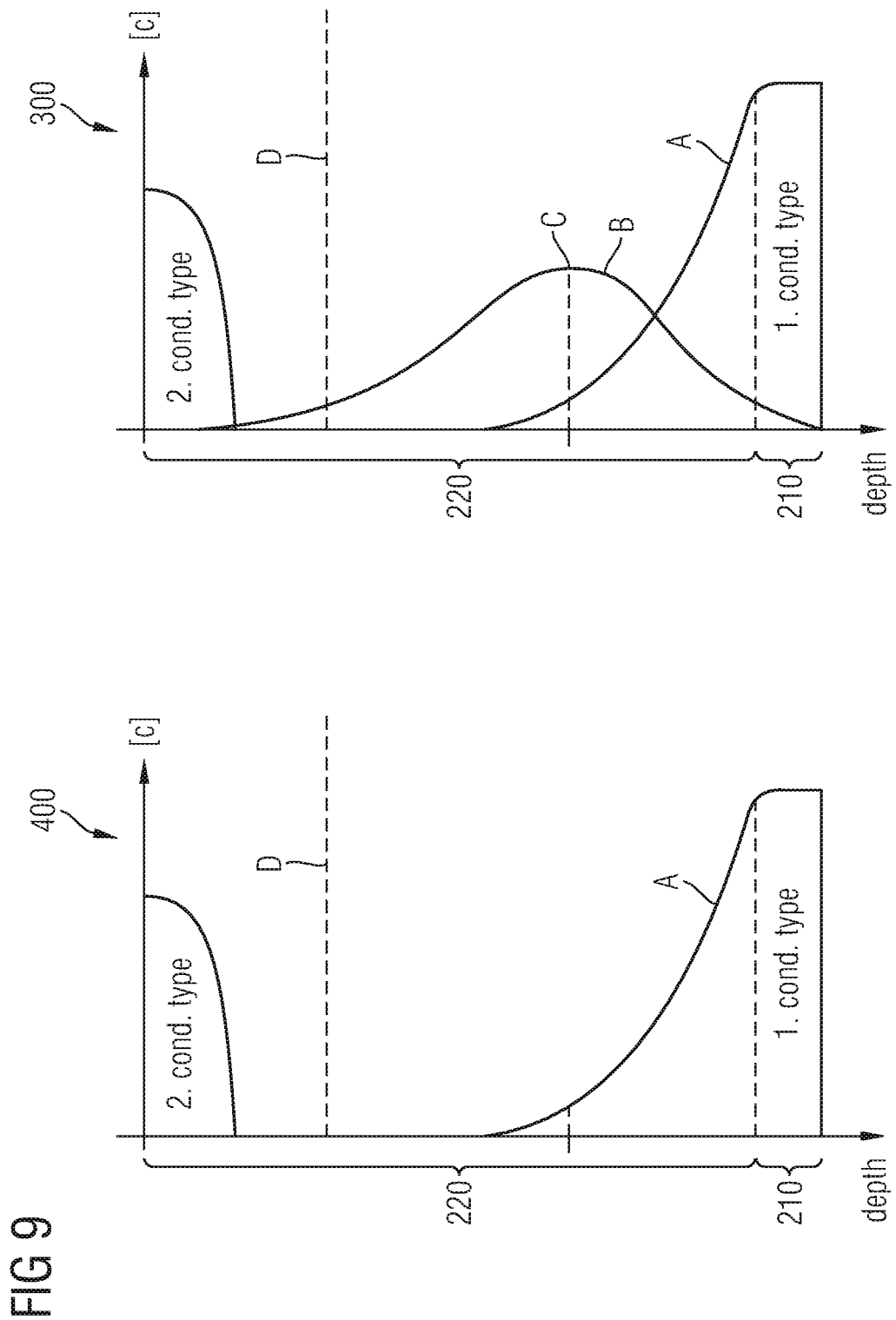
FIG. 9 is a graph illustrating the specific dopant concentration versus a depth in first and second areas of a semiconductor body after the thermal diffusion process in accordance with an embodiment.

According to another embodiment, as shown in FIG. 2B, the vertical dopant profile of the first conductivity type has a shoulder portion E in the second zone next to the body zone 320 in the first area 300 of the semiconductor device 100. The shoulder portion E is generated in case the maximum of the second dopant profile E is covered by the first dopant profile A. As illustrated in FIG. 9 and as will be discussed in detail below, the first dopant profile A and the second dopant profile B may comprise different dopants like phosphor or arsenic. The broadened peak dopant profile B may be a Gaussian profile caused by a thermal diffusion broadening of a peak profile. Depending, inter alia, on a thermal budget and diffusion parameters of dopants, a dopant profile as illustrated in FIG. 2A or FIG. 2B may result in the first area 300.

Thus, the semiconductor device 100 comprises a semiconductor substrate 210 of the first conductivity type having the first area 300 and the second area 400, a semiconductor layer structure 220 on a semiconductor substrate 210 having a vertical dopant profile of the first conductivity type being a superposition of the first dopant profile A declining with increasing distance from the semiconductor substrate 210 and a second dopant profile B being a broadened peak dopant profile selectively formed in the first area 300 in the semiconductor substrate 210, wherein the trenches 312 are formed in the semiconductor layer structure 220 in the first area 300. The first area 300 of the semiconductor substrate 210 comprises the vertical IGFET 310 and the second area 400 comprises the further semiconductor component 410. The semiconductor layer structure 220 comprises the body zone 320 of the vertical IGFET 310 in the first area 300 of the semiconductor substrate 210 and the junction isolation zone 420 for insulating the further semiconductor component 410 from the semiconductor substrate 210 in the second area 400 of the semiconductor substrate 210.

In FIGS. 3 to 11, a method of manufacturing the semiconductor device 100 according to an embodiment will be described with reference to cross-sectional views for illustration of selected processes.

In FIGS. 3 and 4, a first semiconductor layer 222 is formed on the semiconductor substrate 210 of the first conductivity type, e.g. by epitaxial growth or deposition. In an embodiment, the first semiconductor layer 222 may be an undoped layer. In another embodiment, the first semiconductor layer 222 is an epitaxial layer with a low dopant concentration of the first conductivity type. Doping may be carried out in-situ and/or by ion implantation.

Figure 5:
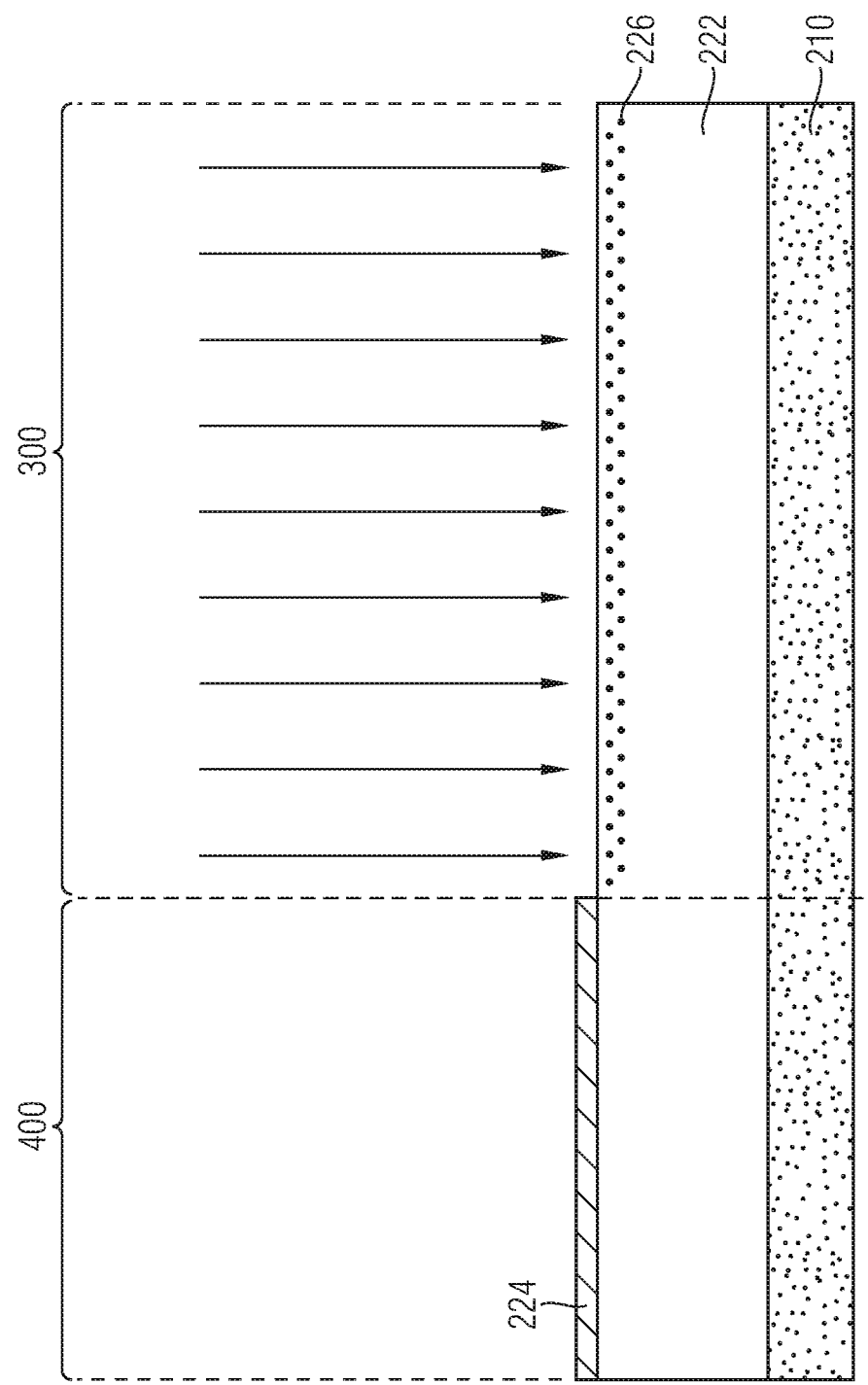

As shown in FIG. 5, an implantation mask 224 is formed on the surface of the first semiconductor layer 222 and patterned lithographically, to selectively implant dopants 226, e.g. phosphorous and/or arsenic into the first semiconductor layer 222 in the continuous first area 300. In an embodiment, the dopants of the first conductivity type are introduced into a shallow zone adjoining the surface of the first semiconductor layer 222 to generate a dopant concentration profile at the surface first semiconductor layer 222 having a peak shape (cf. FIG. 7, first area 300).

Figure 6:
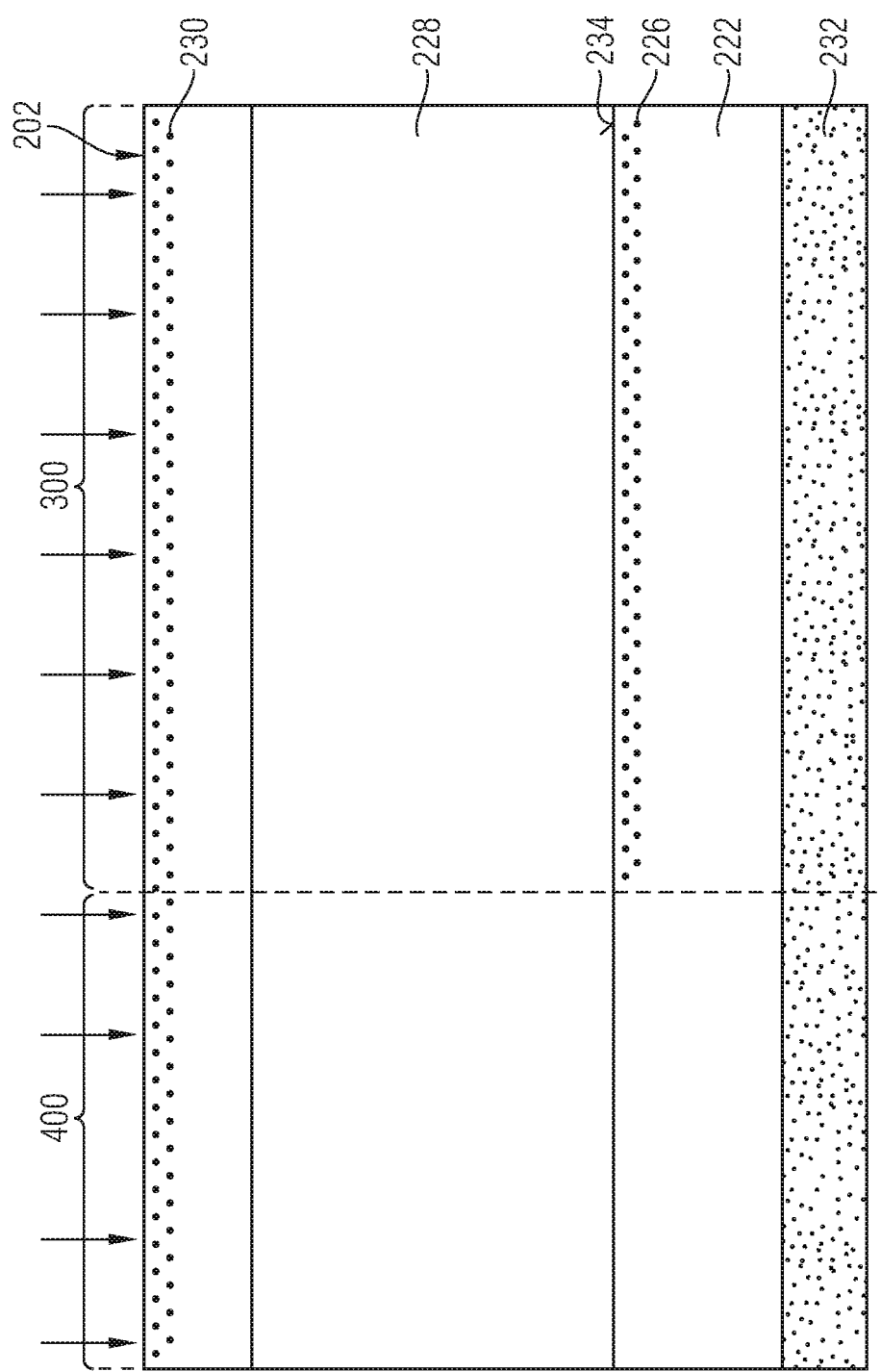

As shown in FIG. 6, after removing the implantation mask 224, a second semiconductor layer 228 is formed, e.g. by epitaxial growth or deposition, on the first semiconductor layer 222 up to the first surface 202 of the semiconductor body 200. Thereafter, dopants 230 of the second conductivity type like boron are introduced into the second semiconductor layer 228 in the first area 300 and the second area 400. In the embodiment shown in FIG. 6, the dopants 230 of the second conductivity type are introduced into the whole surface area of the semiconductor body 200 without any patterned implantation mask. Thus, the junction isolation zone 420 for the semiconductor component 410 and the body zone 320 may be formed by a simultaneous implantation step, leading to a reduction of production costs, since an additional photolithographic step and an additional implantation step for a separate insulating well of the semiconductor component 410 can be omitted. It is, however, also possible to selectively implant dopants of the second conductivity type into predetermined areas within the first area 300 or the second area 400.

It is further possible to introduce the dopants 230 of the second conductivity type during the growth process of the second semiconductor layer 228. According to an embodiment, the second semiconductor layer 228 is an undoped layer. In a further embodiment, the second semiconductor layer 228 is grown with an intrinsic low dopant concentration of the first conductivity type. Thus, at least one of the first semiconductor layer 222 and the second semiconductor layer 228 may be an undoped layer. In an embodiment, both semiconductor layers 222, 228 are undoped layers. The vertical dopant profile of the semiconductor body 200 after the implantation processes of FIGS. 5 and 6 is shown in FIG. 7.

Figure 7:
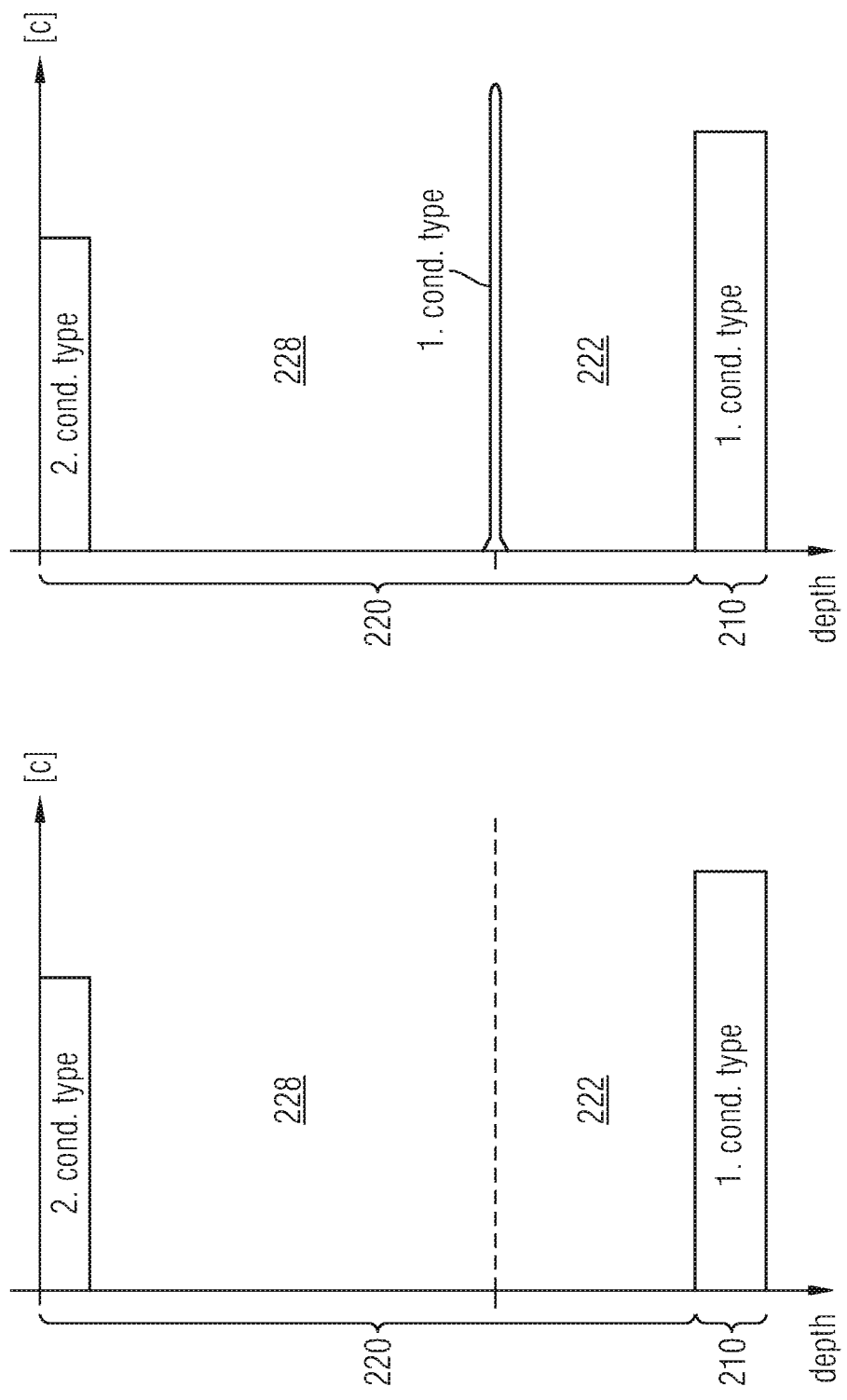
FIG. 7 is a graph illustrating a specific dopant concentration versus a depth in first and second areas of a semiconductor body in accordance with an embodiment.

As illustrated in FIG. 7, the semiconductor substrate 210 has a large dopant concentration of the first conductivity type. In an embodiment, the dopant concentration of the semiconductor substrate 210 is $10^2$ to $10^3$ times higher than the dopant concentration of the first semiconductor layer 222 and/or the second semiconductor layer 228. In an upper part of the second semiconductor layer 228, the dopants 230 of the second conductivity type is provided. At a boundary between the first semiconductor layer 222 and the second semiconductor layer 228, the dopants 226 of the first conductivity type are located in such a way that a peak dopant profile, i.e. a thin layer with high dopant concentration is provided. A full width of half maximum (FWHM) of the as-implanted peak dopant profile may range between 10 nm and 200 nm. The dopant concentration of the maximum of the peak dopant profile may range between $10^{16}$ cm$^{-3}$ to $10^{21}$ cm$^{-3}$.

Figure 8:
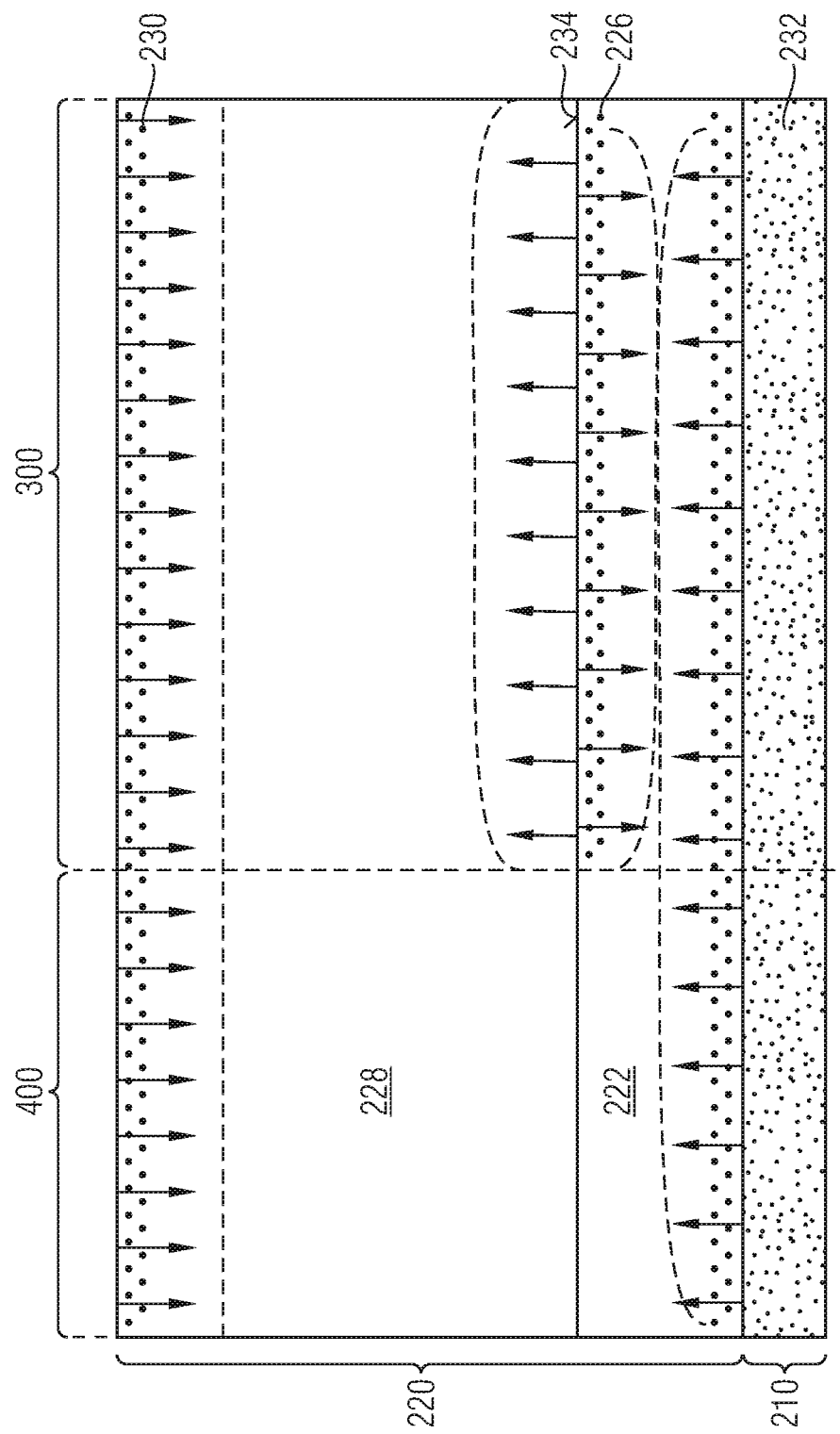
FIG. 8 is a cross-sectional view of a semiconductor body illustrating a thermal diffusion process in accordance with an embodiment.

FIG. 8 illustrates a thermally induced diffusion process of the dopants within the semiconductor body 200. Herein, dopants 232 of the first conductivity type diffuse from the substrate 210 into the first semiconductor layer 222. The dopants 226 of the first conductivity type diffuse into the first semiconductor layer 222 and into the second semiconductor layer 228, each having a lower dopant concentration in comparison to a boundary layer 234 between the first semiconductor layer 222 and the second semiconductor layer 228. The dopants 230 of the second conductivity type diffuse from an upper part of the second semiconductor layer 228 into the direction of the first semiconductor layer 222 and the semiconductor substrate 210.

Due to the thermally induced diffusion of the dopants 226, the peak dopant profile of the dopants 226 as shown in FIG.

7 is broadened, resulting in the second dopant profile B as illustrated in FIG. 9, for example. In addition, the diffusion of the dopants 232 of the first conductivity type out of the substrate 210 into the first semiconductor layer 222 leads to a vertical dopant profile a first conductivity type declining with increasing distance from the drain electrode 328 or the semiconductor substrate 210, to form the first dopant profile A. The dopants 232 of the semiconductor substrate 210 may be different to the dopants 226 of the peak dopant profile B. For example, the dopants 232 of the semiconductor substrate 210 may comprise phosphorous, wherein the dopants 226 of the peak dopant profile may comprise arsenic, or vice versa. A species of dopants 226, 232 may also be same. Due to the thermally induced diffusion broadening of the second dopant profile B being a broadened peak dopant profile, an electrically conducting drift zone 324 is provided between the substrate 210 or the drain electrode 328 and the body zone 320 of the second conductivity type. Since the second dopant profile B is absent in the second area 400 (cf. FIG. 9), the semiconductor component 410 in the second area 400 has a higher breakdown voltage than the vertical IGFET 310 in the first area 300.

The resulting vertical net dopant concentration profile in the semiconductor body 200 after the thermal diffusion step in the first area 300 is defined by a superposition of the homogeneous dopant concentration of the semiconductor substrate 210, of the diffusion tail of the dopants 332 diffused from the semiconductor substrate 110 into the first semiconductor layer 222, of the broadened peak dopant concentration of dopants 226 centered around the boundary between the first semiconductor layer 222 and the second semiconductor layer 228, and of the implantation zones at the first surface 202, determining the channel characteristics of the vertical IGFET like the body zones 320 and the source zones 322.

Thus, the semiconductor region in the first area 300 for the vertical IGFET 310 can be selectively optimized with respect to the dopant profile and the dopant concentration, without restrictions resulting from the semiconductor components 410 in the second area 400. In addition, it is possible to provide the second dopant profile B only below the gate trenches of the trenches 312 of the vertical IGFET 310, wherein the second dopant profile B is absent below the edge termination trenches of the trenches 312 of the vertical IGFET 310, in order to increase the breakdown voltage of the vertical IGFET 310. Due to the broadened peak dopant profile B, the dopant concentration of the first conductivity type increases with increasing distance from the first surface 202 in the direction to the semiconductor substrate 210 and to the bottom region of the trenches 312. Thus, an improvement in the area-specific on-state resistance is achieved.

Figure 10:
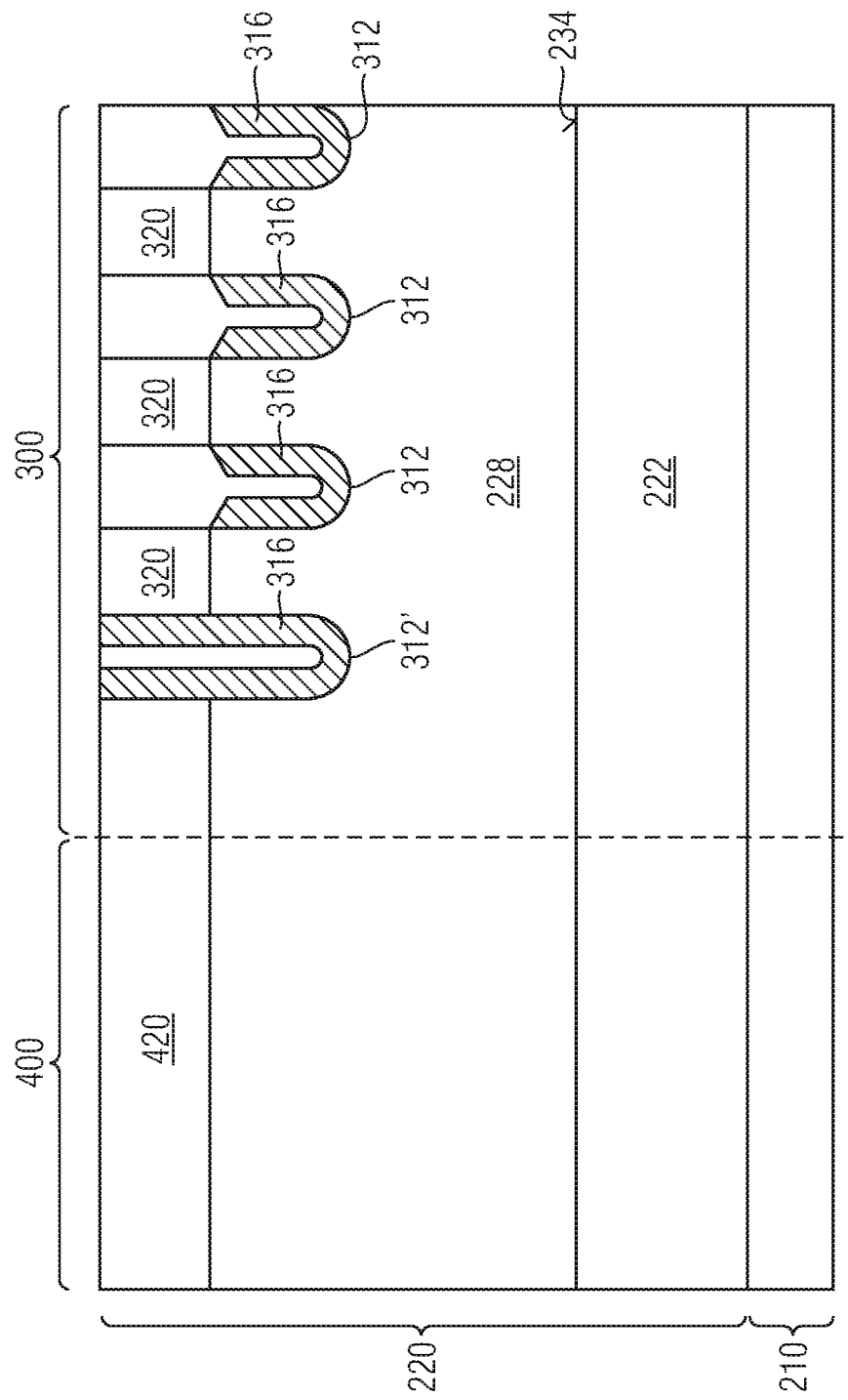
FIGS. 10 to 11 are cross-sectional views illustrating a method of manufacturing a semiconductor device in accordance with an embodiment.

As shown in FIG. 10, the trenches 312 of the at least one vertical IGFET 310 are formed within the second semiconductor layer 228 and a field dielectric structure 316 is formed within the trenches 312. The trenches 312 may be formed in the second semiconductor layer 228 in the continuous first area 300. The trenches 312 may be formed in such a way that they end in the second semiconductor layer 228 and do not extend into the first semiconductor layer 222. In this case, the maximum C of the second dopant profile B is located below the trenches 312 of the vertical IGFET 310.

Figure 11:
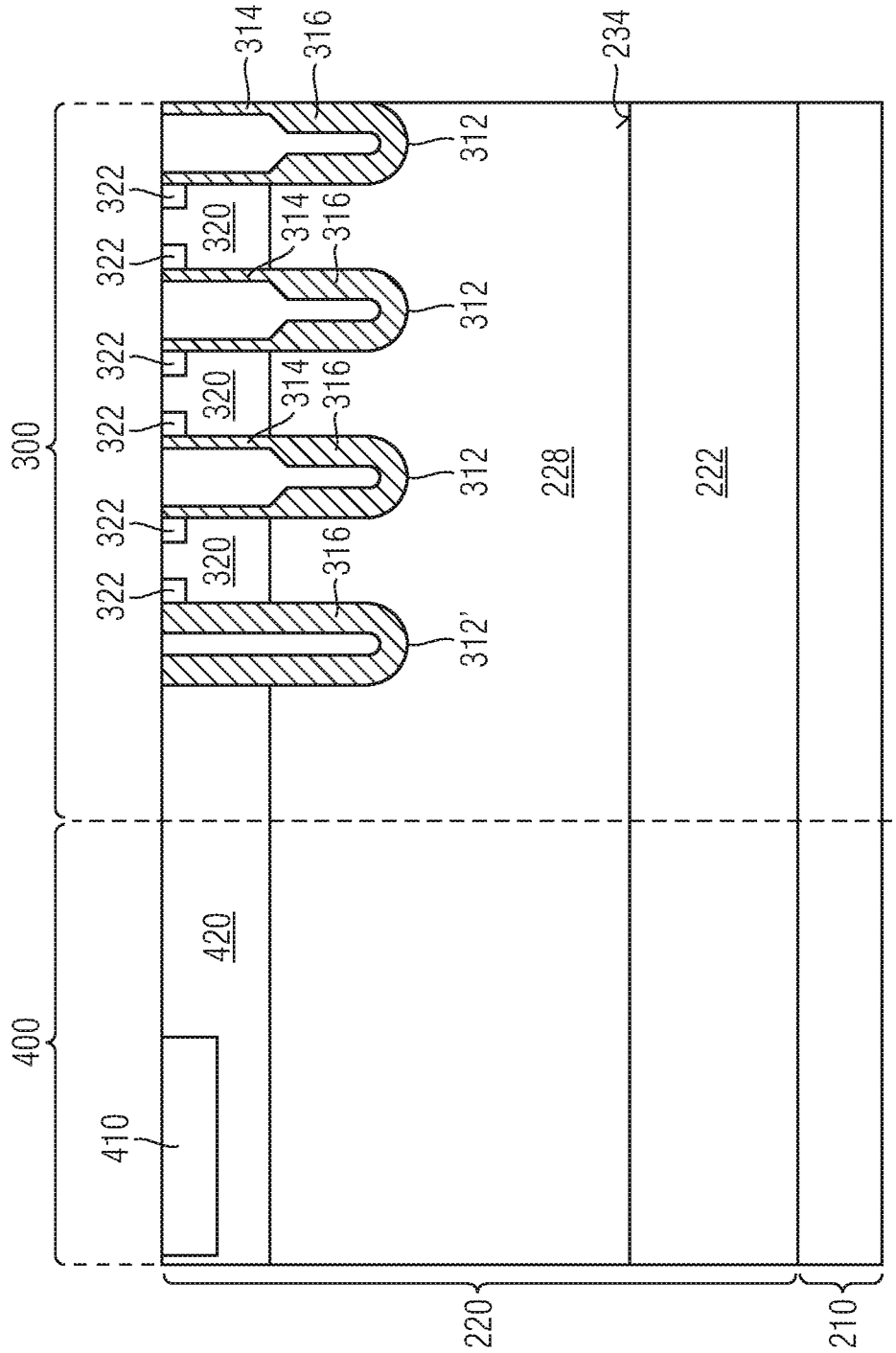

As shown in FIG. 11, the gate dielectric structure 314 lining the sidewalls of the trenches 312 is formed by a dry oxidation process. In addition, the source zones 322 are formed within the body zones 320 by counter doping with dopants of the first conductivity type. Furthermore, the semiconductor component 410 is formed within the junction isolation zone 420 of the second conductivity type. Furthermore, the wiring and insulation region 500 is formed on the semiconductor 200 as shown in FIG. 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a first semiconductor layer on a semiconductor substrate of a first conductivity type having a continuous first area and a second area; thereafter
    introducing dopants of the first conductivity type in the continuous first area of the first semiconductor layer; and thereafter
    forming a second semiconductor layer on the first semiconductor layer; and
    forming trenches in the second semiconductor layer in the continuous first area.

2. The method of claim 1, wherein the trenches end in the second semiconductor layer.

3. The method of claim 1, further comprising thermally induced diffusion of the dopants of the semiconductor substrate and of the first semiconductor layer into the first and the second semiconductor layers.

4. The method of claim 1, wherein at least one of the first and second semiconductor layers are undoped layers.

5. The method of claim 1, wherein the dopants in the semiconductor substrate and the first semiconductor layer are different.

6. The method of claim 1, further comprising forming a vertical IGFET in the continuous first area of the semiconductor substrate having a drain zone in the semiconductor substrate and further semiconductor components in the second area of the semiconductor substrate being electrically insulated from the semiconductor substrate.

7. The method of claim 3, wherein a diffusion profile of the dopants of the semiconductor substrate and of the first semiconductor layer overlap.

8. The method of claim 5, wherein the different dopants comprise phosphorus and arsenic.

9. The method of claim 1, wherein the dopants of the first conductivity type are introduced by an ion implantation process.

10. The method of claim 9, wherein a full width of half maximum, FWHM, of an as-implanted peak dopant profile of the dopants is in a range between 10 nm and 200 nm.

11. The method of claim 9, wherein a maximum of an as-implanted peak dopant profile of the dopants is in a range between $10^{16}$ cm$^{-3}$ and $10^{21}$ cm$^{-3}$.

12. The method of claim 1, wherein a dopant concentration of the semiconductor substrate is 1E2 to 1E5 times larger than a dopant concentration of the first semiconductor layer.

* * * * *